United States Patent
Oldfield et al.

(10) Patent No.: US 6,665,166 B2
(45) Date of Patent: Dec. 16, 2003

(54) SYSTEMS WITH ENHANCED ELECTROSTATIC DISCHARGE PROTECTION

(75) Inventors: Barry J. Oldfield, Boise, ID (US); Herbert J. Tanzer, Folsom, CA (US); Brian Tsuyuki, Roseville, CA (US); David J. Pommerenke, Rolla, MO (US); Mohammad M. Bari, Boise, ID (US); Peter Gysling, New Plymouth, ID (US); Jon C. Anson, Meridian, ID (US); Richard G. Sevier, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 325 days.

(21) Appl. No.: 09/809,409

(22) Filed: Mar. 15, 2001

(65) Prior Publication Data

US 2002/0131226 A1 Sep. 19, 2002

(51) Int. Cl.$^7$ ............................... H05F 3/00; H05K 7/16
(52) U.S. Cl. ......................... 361/212; 361/727
(58) Field of Search ................. 361/212, 211, 361/220, 413, 634, 636, 632, 633, 727

(56) References Cited

U.S. PATENT DOCUMENTS

| | | | | |
|---|---|---|---|---|
| 4,439,809 A | * | 3/1984 | Weight et al. | 361/220 |
| 4,791,524 A | * | 12/1988 | Teigen et al. | 361/212 |
| 4,849,944 A | * | 7/1989 | Matsushita | 371/21 |
| 6,097,604 A | * | 8/2000 | Hunter et al. | 361/727 |

* cited by examiner

Primary Examiner—Rajnikant B. Patel (57) ABSTRACT

Systems and methods for protecting electronic devices from electrostatic discharge are provided. A preferred system includes a module configured to be received by an enclosure. The module incorporates an electronic component, such as a memory device, processor, and/or circuit assembly, for example, that is configured to electrically communicate with at least a portion of the enclosure when the module is received by the enclosure. The module also includes a first contact portion that is arranged to contact the enclosure as the module is received by the enclosure. Preferably, the first contact portion is formed, at least partially, of a dissipative material. So configured, when the first contact portion engages the enclosure, an electrostatic charge of the module may be discharged in a controlled manner. Methods also are provided.

24 Claims, 5 Drawing Sheets

SYSTEMS WITH ENHANCED ELECTROSTATIC DISCHARGE PROTECTION

BACKGROUND OF THE INVENTION

1. Field of the Invention

The present invention generally relates to electronic equipment and, in particular, to systems and methods utilizing modules that are configured for providing controlled dissipation of electrostatic charges.

2. Description of the Related Art

As is known, electronic equipment is particularly vulnerable to electrostatic discharge (ESD). More specifically, an ESD event may physically damage an associated electronic component(s) or, otherwise, cause improper operation of the component(s) due to magnetic and electric fields resulting from such an event. Typically an "ESD event" is a reference to the transfer of charge as two objects become close enough for current to flow therebetween. The electrical and magnetic fields are the result of the current that flows during the discharge. When the fields couple into electrical circuits they may cause damage or disruption as a result of the discharge event.

Electronic equipment, such as "always-on" equipment, that supports hot-plugging and/or swapping of modules is particularly vulnerable to ESD. Even relatively small ESD events can couple enough energy through an open slot of such equipment to disrupt operating circuitry. For instance, when a particular module is removed from a chassis, for example, a resulting gap in shielding formed by the module-chassis assembly may enable magnetic and/or electric fields to enter the equipment. These magnetic and/or electric fields can potentially couple to electrical circuits housed within the equipment.

Insertion of a module within a chassis also may cause an ESD event. For instance, when a module is handled without proper ESD precautions, a build-up of charge may be exhibited by the module. This may result in an ESD event as the module approaches and/or engages the chassis. Oftentimes, an ESD event may be influenced by the physical configuration of the module and its respective chassis. In particular, many module/chassis configurations provide metal-to-metal first contact points (areas) where the module and chassis first engage each other during hot-plugging and/or swapping. These contact points may promote ESD events that are typically one to two orders of magnitude greater than an ESD discharge facilitated by an operator's finger, for example. Moreover, since the equipment typically is operational during such hot-plugging and/or swapping, relatively small uncontrolled ESD events can cause operational errors in the equipment.

SUMMARY OF THE INVENTION

Briefly described, the present invention relates to protection of electronic devices that are vulnerable to electrostatic discharge. In this regard, embodiments of the present invention may be construed as providing enhanced electrostatic discharge protection systems. In a preferred embodiment, the system includes a module configured to be received by an enclosure. The module incorporates an electronic component, such as a memory device, processor, and/or circuit assembly, for example, that is configured to electrically communicate with at least a portion of the enclosure when the module is received by the enclosure. The module also includes a first contact portion that is arranged to contact the enclosure as the module is received by the enclosure. Preferably, the first contact portion is formed, at least partially, of a dissipative material. So configured, when the first contact portion engages the enclosure, the electrostatic charge of the module is discharged at a controlled rate by the dissipative material and at least partially dissipated as heat.

Other embodiments of the invention may be construed as providing methods for enhancing electrostatic discharge protection in an electrical system. Typically, such a system includes an enclosure that is configured to engage and disengage a module while electrical power is applied to the system. In a preferred embodiment, the method includes the steps of: (1) providing a module configured to form an electrical path between the module and the enclosure, the module having a dissipative material electrically disposing along, at least a portion of, the electrical path; (2) electrically engaging the enclosure with the module to form the electrical path between the module and the enclosure; and (3) dissipating, at least partially, an electrostatic charge of the module as heat. Preferably, the resistive electrical path is formed between the module and the enclosure while maintaining the physical distance required to prevent arcing.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF A PREFERRED EMBODIMENT

As mentioned briefly hereinbefore, hot-plugging and/or swapping of a module within a system enclosure may result in a potentially damaging or disruptive electrostatic discharge (ESD) event. As described in detail hereinafter, systems and methods of the present invention provide a controlled discharge rate of an amount of charge on a module. This potentially limits peak currents and resulting fields of such an ESD event, thereby reducing the opportunity for an ESD event to damage or, otherwise, hinder the operability of associated electronic components.

Figure 1:
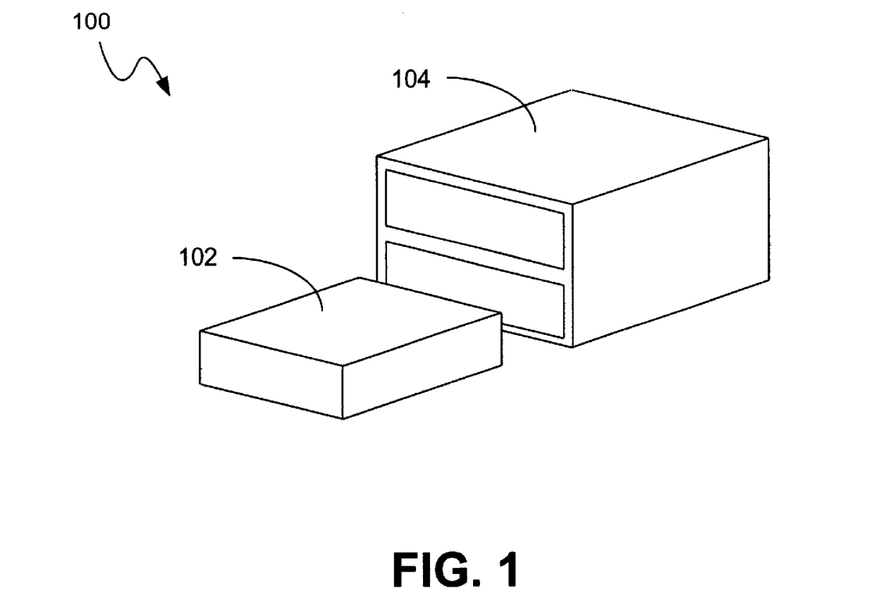
FIG. 1 is a schematic diagram depicting a representative module and chassis of the enhanced electrostatic discharge protection system of the present invention.

As shown in FIG. 1, a preferred embodiment of the enhanced electrostatic discharge protection system 100 of the present invention includes a module 102 and a system enclosure or chassis 104 that is adapted to receive one or more modules. The modules and enclosures of the present invention may be provided in numerous configurations, with preferred embodiments of the present invention embodying modules that are adapted for hot-plugging and/or swapping within their respective enclosures. By way of example, embodiments of modules of the present invention may be configured as controllers, disk drive carriers, etc. As utilized herein, the terms "hot-plugging" and "hot-swapping" refer to the operation of inserting a module into and/or removing a module from a corresponding system enclosure while power is operatively applied to components of the system.

In order to reduce the tendency of a potentially damaging ESD event to occur during hot-plugging and/or swapping of a module, module 102 is, at least partially, formed of a dissipative material, e.g., a material that is configured to provide a controlled discharge rate of an electrostatic charge of the module. By way of example, a conductive plastic may be utilized that is particularly selected with electrical properties that, in combination with the configuration of the module and/or chassis, are intended to avoid electrical arcing between the module and its respective chassis.

In a preferred dissipative material, a conductive fill material, such as graphite, for example, is added to a base material, e.g., plastic. Various other base materials and fill materials, however, may be utilized, such as nickel and/or silver, among others. In some embodiments, such a dissipative material may include approximately 10%–20% fill by weight. The amount of fill utilized will, of course, vary depending upon the particular application and requisite mechanical and electrical properties of the material. For instance, one practical upper limit on the amount of fill to be utilized is imposed when the mechanical properties of the material become unsuitable for their intended use. Moreover, one practical lower limit on the amount of fill to be utilized is imposed when the lack of conductivity provided by the material results in metal to metal arcing of the charge of the module. More specifically, if the resistivity of the material is too high, the charge may not sufficiently dissipate via the material as the module approaches the chassis.

A preferred dissipative material that may be utilized by the present invention is commonly referred to a "conductive plastic," such as Noryl HMC1010, by GE Plastics, for example. However, it should be noted that, in general, a conductive material typically is characterized by a surface resistivity of 0 to $10^5$ $\Omega$/square, whereas a dissipative material is characterized by a surface resistivity of $10^5$ to $10^9$ $\Omega$/square.

Another property to consider of a dissipative material, such as conductive plastic, is uniform volume resistivity. Uniform volume resistivity causes a charge of a module to spread out throughout the dissipative material instead of following a discrete path. Propagation of charge along such a path can result in enough heat generation to leave a "carbon track." Carbon tracks are the result of sufficient current flowing through a small enough area that sufficient heat is generated to burn/carbonize the dissipative material. Thereafter, proper dissipation of a charge through the material is difficult to achieve.

Another benefit potentially achieved by embodiments of the present invention is that dissipative materials, such as conductive plastic, do not tend to pick-up a static charge when rubbed against the metal material of a chassis, as may occur during hot-plugging and/or swapping. As is known, materials, such as non-conductive plastic, tend to pick-up a static charge when slid against metal.

Figure 2:
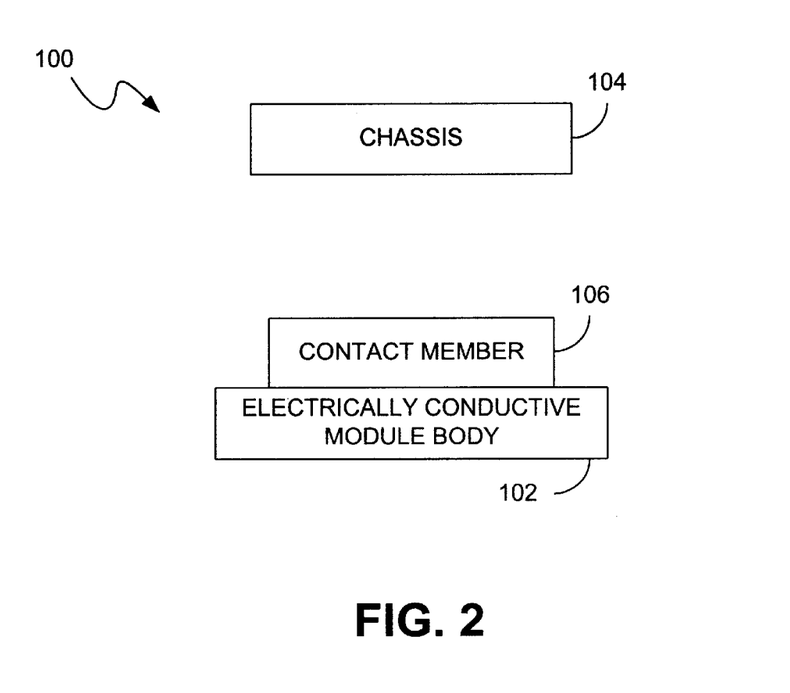
FIG. 2 is a schematic diagram depicting an alternative embodiment of the present invention.

As depicted in FIG. 2, an embodiment of module body 102 is provided that preferably is formed, at least partially, of metal, such as conductively-plated sheet metal. Module body 102 is adapted to engage a chassis 104, such as by inserting the module within an appropriate module-receiving slot (not shown) of the chassis. A contact member 106 of the module is configured to be a first contact point (area) between the body of the module and the chassis. The contact member may be formed of a dissipative material that is adapted to dissipate ESD events in a controlled manner. Thus, the module body may be formed of a material(s) possessing superior thermal properties, e.g., metal, and the contact member may be formed, at least in part, of dissipative material.

Figure 3:
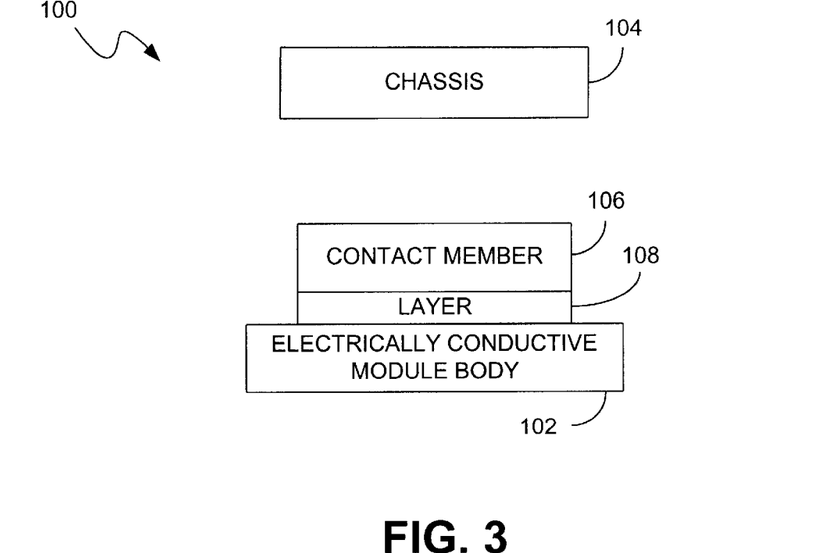
FIG. 3 is a schematic diagram depicting an alternative embodiment of the present invention.

In the embodiment depicted in FIG. 3, a dissipative element 108 is disposed between contact member 106 and module body 102. Preferably, the dissipative element is provided in the form of one or more layers. By way of example, dissipative element 108 may be a resistive surface film, tape, and/or adhesive, among others. The material of dissipative element 108 should have sufficient physical dimensions to prevent arcing around the edges of the layer (s) as well as sufficient thickness to prevent breaking down of the material, e.g., arcing through. In those embodiments incorporating an adhesive layer(s), the layer(s) may function to retain the contact member in position relative to the module body in addition to providing a pre-selected resistive path between the module body and contact member. It should be noted that any adhesive layer(s) should be configured so as to not provide an insulation barrier between dissipative element 108 and 102 module body.

Figure 4:
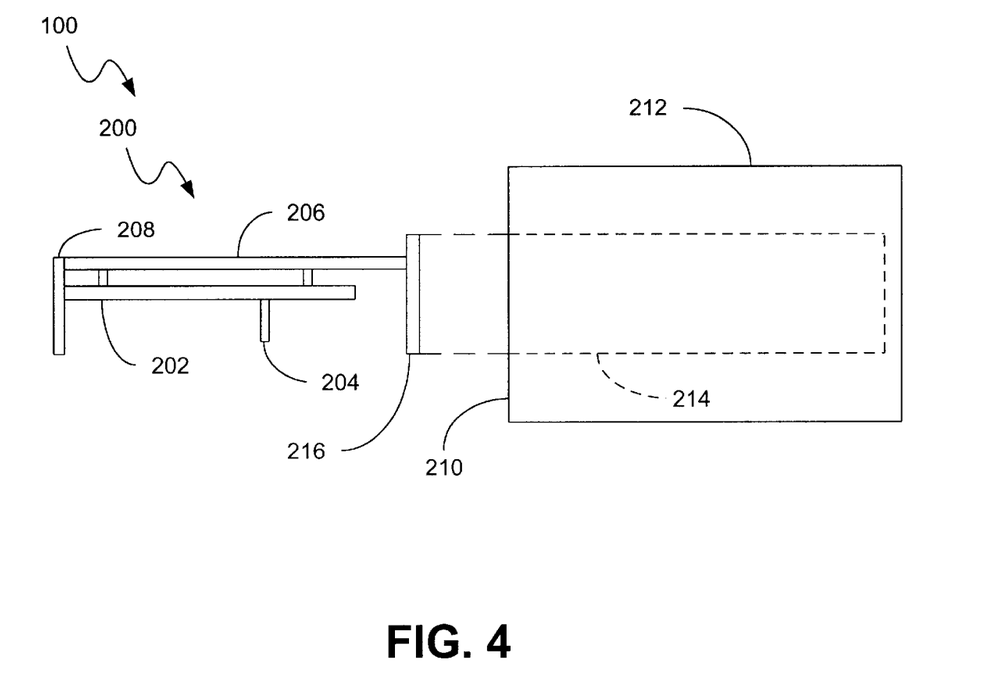
FIG. 4 is a schematic diagram depicting a preferred embodiment of a controller module of the present invention incorporating a dissipative first contact member.

Referring now to FIG. 4, a preferred embodiment of a controller module 200 is provided that incorporates a dissipative material for controlling ESD events. Control module 200 includes a one or more of various electronic components, including, for example, a printed circuit board (PCB) assembly 202 and memory device 204. PCB 202 and memory device 204 are mounted to a platform or stiffener 206, which provides structural support to the module. Additionally, a module bulkhead 208 is provided at an end of the module. The bulkhead is adapted to cooperate with a front panel 210 of a system enclosure 212. So provided, when the controller module is received within a slot 214 of the enclosure, the bulkhead and various exterior surfaces of the enclosure protect and house the electronic components of the controller module. The bulkhead-to-enclosure interface also is configured to provide proper electromagnetic interference (EMI) operation of the system. For instance, physical contact preferably is provided between all mating surfaces.

Preferably, enclosure 212 is formed of sheet metal with a conductive plating. Typically, surfaces in the area intended for contact with the controller 202 are not painted or plated with a non-conductive coating.

Controller 202 also incorporates a guide foot 216 that is adapted to be a first point of contact between the controller module and the enclosure when the controller is being inserted within a slot of the enclosure. For instance, during a hot-plugging and/or swapping operation, guide foot 216 is first brought into engagement with the material of the system enclosure. Since guide foot 216 is, at least partially, formed of dissipative material (described hereinbefore), a controlled dissipation of any charge to be dissipated to or from the module is facilitated by the guide foot. This is accomplished, at least in part, by the dissipative material dissipating much of any such current as heat. In those embodiments incorporating a guide foot that is not entirely formed of dissipative material, the portion formed of dissipative material should form a complete resistive path between first contact point and module ground. Additionally, the physical dimensions of the guide foot preferably are configured to ensure that the dissipative path connection is made at a distance that prevents arcing between the module and system enclosure.

As the name implies, guide foot 216 also may be utilized to appropriately align the controller module within slot 214 of the enclosure. More specifically, in preferred embodiments, the guide foot is configured to engage corresponding portions of the enclosure structure, such as a portion(s) that defines the slot, for example, so that the module can be conveniently inserted to an appropriate mounting position within the enclosure.

Figure 5:
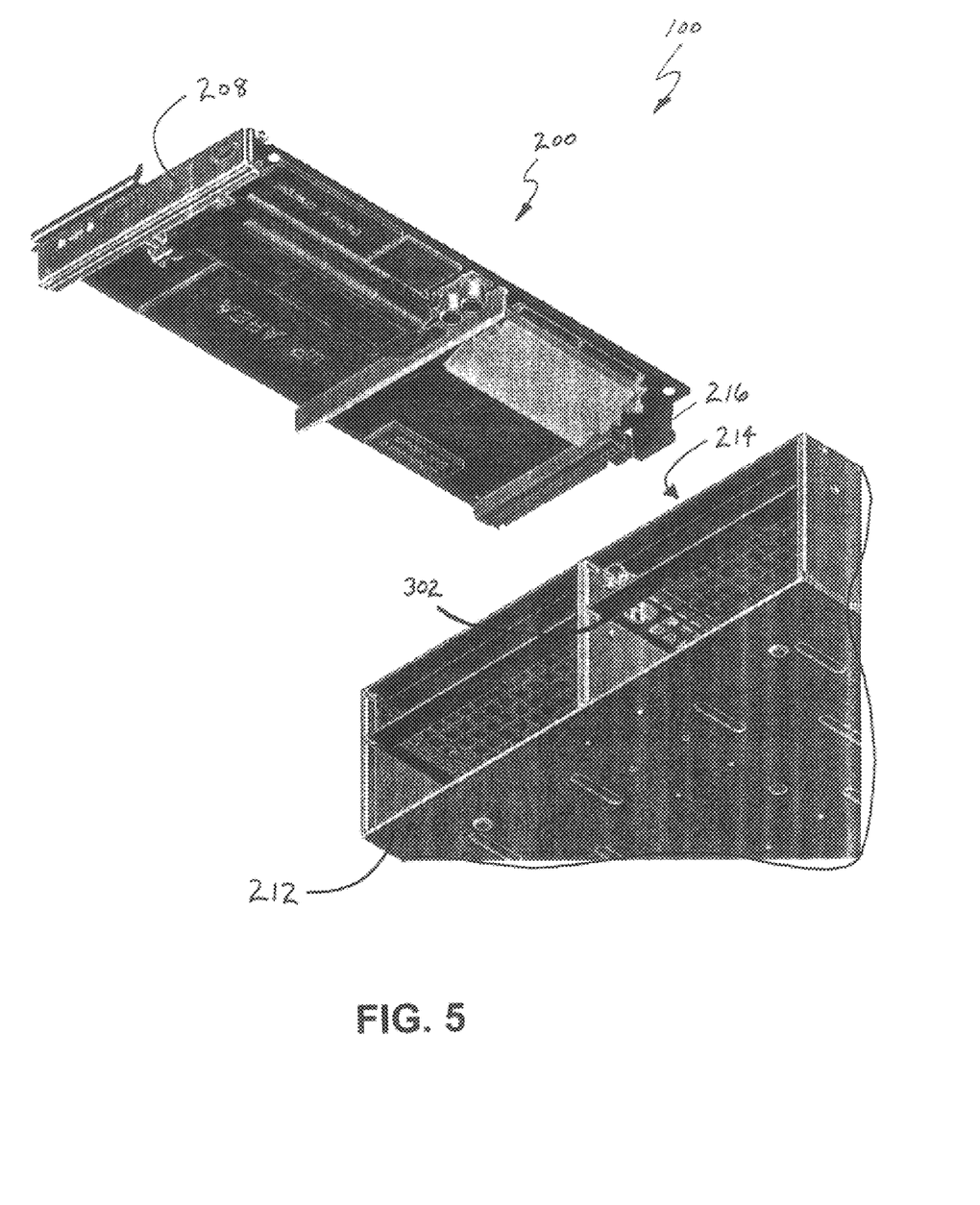
FIG. 5 is a partially cut-away, perspective view of the controller and chassis of FIG. 4.

As shown in FIG. 5, guide foot 216 is configured to engage a surface of divider 302. So configured, the controller module may be directed into the slot 214 by engaging the distal end of the guide foot with the upper surface of the divider and urging the controller module toward its mounted position. Also note that the guide foot and the module bulkhead provide support points so that setting the controller down on a surface, such as provided by a table, does not require utilizing the memory device as a support structure for the controller.

As the guide foot protrudes from the controller module at the end of the module that is first inserted into a slot of the enclosure, the guide foot serves as the first contact point for the controller module. Thus, any ESD event should be dissipated between the guide foot and the enclosure, e.g., between the guide foot and the divider.

Figure 6:
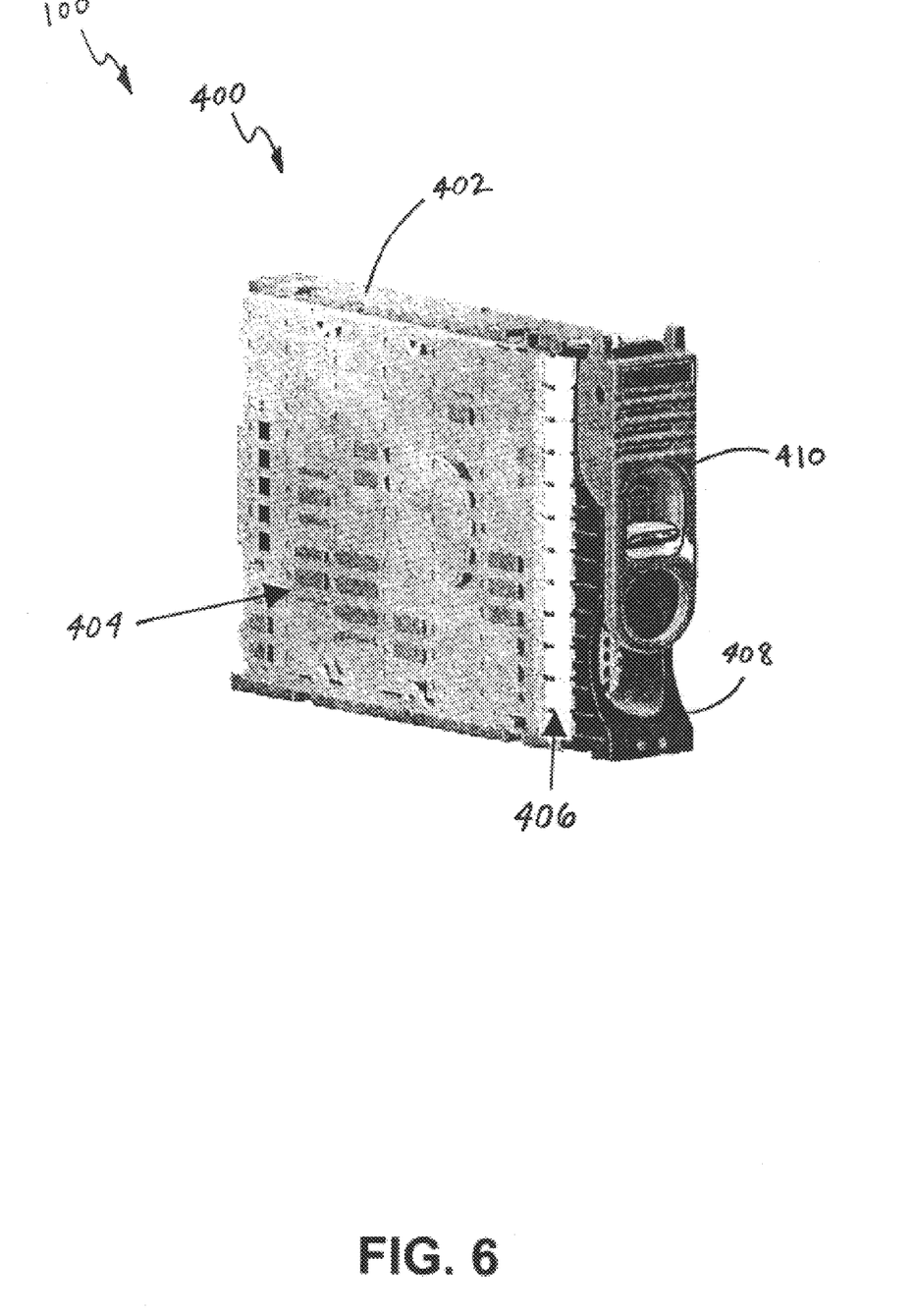
FIG. 6 is a perspective view of a preferred embodiment of a storage medium carrier module of the present invention incorporating a dissipative first contact member.
Figure 7:
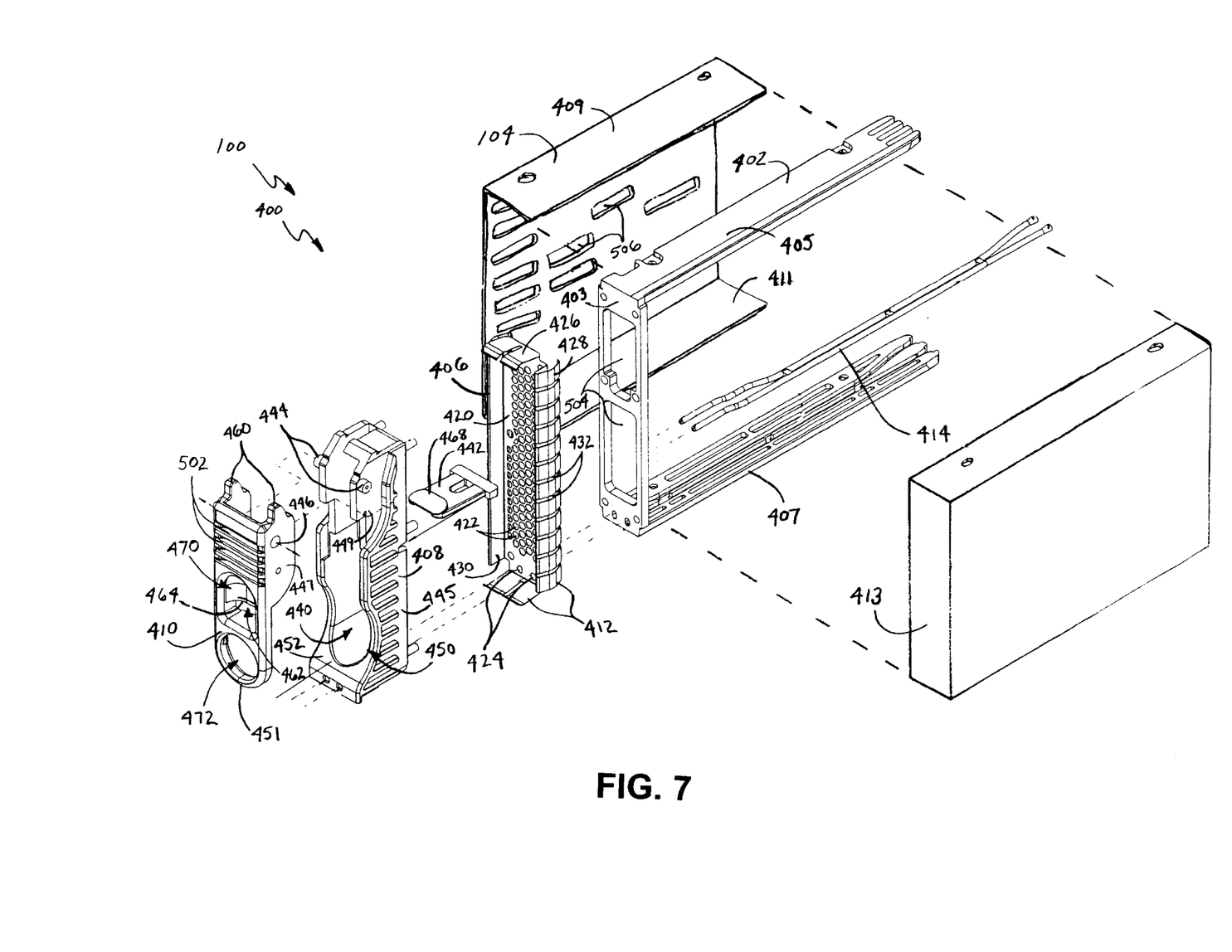
FIG. 7 is a partially-exploded, partially-schematic, perspective view of the disk drive carrier of FIG. 6.

Referring now to FIGS. 6 and 7, an alternative embodiment of the enhanced electrostatic protection system 100 will be described. More specifically, the embodiment depicted in FIGS. 6 and 7 is configured as a storage medium carrier module 400 that incorporates dissipative material to control ESD events.

In FIG. 6, the representative embodiment of the carrier module 400 includes a carrier frame 402 that is sized and shaped for receiving and mounting a storage medium, such as a disk drive, for example. Partial encasement of a storage medium within carrier 400 is facilitated by a protective circuit assembly (PCA) cover 404 that is adapted to mate with the carrier frame 402. Once so mated, carrier frame 402, PCA cover 404, and a respective storage medium cooperate so as to provide a protective enclosure for more sensitive components of the storage medium, such as storage medium circuit assembly. For example, and not for the purpose of limitation, the storage medium circuit assembly may be positioned between the PCA cover 404 and an opposing exterior surface of the storage medium.

As shown in the embodiment of FIG. 6, carrier module 400 includes an electromagnetic interference (EMI) shield 406, a carrier bezel 408, and a handle 410. In some embodiments, handle 410 provides the dual functionality of serving as a carrying handle that may be utilized for repositioning the carrier and a locking mechanism for facilitating secure mounting of the carrier to an appropriate chassis or other mounting device. Preferably, the EMI shield incorporates spring fingers 412.

In FIG. 7, it is shown that frame 402 incorporates a face plate 403 and rails 405 and 407 which extend outwardly from face plate 403. Frame 402 is formed, at least partially, of dissipative material. In a preferred embodiment, the dissipative material is GE-Noryl plastic, which includes approximately 10% graphite, although other materials may be utilized. In order to facilitate dissipation of charge between the carrier module and a corresponding chassis (not shown), one of the rails, e.g., rail 405, may be provided with a length that is longer than the other of the rails. This longer rail may serve as a first contact point between the module and the chassis. So configured, the longer rail formed, at least partially, of dissipative material, may prevent metal of the carrier from approaching close enough to the chassis to provide an ESD event until any charge has been sufficiently dissipated from the module.

Frame 402 is configured to receive PCA cover 404. By way of example, in the embodiment depicted in FIG. 5, sidewalls 409 and 411 of PCA cover 404 engage between rails 405 and 407 of frame 402. Sidewalls 409 and 411 are appropriately spaced to receive a storage medium device, e.g., a disk drive 413. Thus, the storage medium device may be received at least partially between sidewalls 409 and 411.

Storage medium device 413 and PCA cover 404 may be mounted to frame 402, such as by aligning mounting holes of storage medium device 413, mounting holes of PCA cover 404, and mounting holes of frame 402, and then inserting mechanical fasteners through the aligned holes. In some embodiments, structural stability of the mounted storage medium device 413 may be promoted by a snug fit of the device 413 between sidewalls of the PCA cover and, similarly, a snug fit of the sidewalls of the PCA cover between the rails of the frame 402. The snug fit of the sidewalls of the PCA cover between the rails of the frame 402 also tends to be promoted by the mechanical fasteners, which urge the rails against the PCA cover as the fasteners are tightened.

Frame 402 is adapted to engage a lightpipe assembly 414. Additionally, frame 402 and, more specifically, faceplate 403, is adapted to engage EMI shield 406. EMI shield 406 includes a body portion 420 that defines various apertures. In particular, an array of apertures 422 is provided, with the apertures 422 being sized and shaped to impede and/or prevent the propagation of electromagnetic energy from components arranged behind shield 406, e.g., storage medium device 413. In some embodiments, apertures 422 each are configured with a hexagonal shape and also provide the function of enabling air to flow through the shield to promote cooling of the storage medium device 413. Body portion 420 also includes apertures 424 that are adapted to facilitate placement and/or viewing of lightpipe assembly 414.

Preferably, spring fingers 412 depend from body portion 420, such as along an outer periphery of the body portion. Various numbers and configurations of spring FIGS. 412 may be provided with the various numbers and configurations providing one or more of the following functions: (1) promoting structural stability to externally and/or internally generated shock and/or vibration; (2) promoting electrical continuity between carrier 400 and a component(s) to which it is mounted, and/or other carriers of such a component(s); and (3) enhancing EMI and/or ESD control of the carrier.

By way of example, the embodiment of the EMI shield 406 depicted in FIG. 5 includes both forward-facing spring fingers 426 and rearward-facing spring fingers 428 (forward-facing generally referring to a direction away from storage medium device 413, and rearward-facing generally referring to a direction toward storage medium device 413). Spring fingers 428 preferably extend from flanges 430, which, in combination with the forward-facing spring fingers 426, are adapted to extend about at least a portion of bezel 408.

EMI shield 406 is formed, at least partially, of an appropriate shielding material, such as stainless steel, among others. EMI shield 406 also is formed of an appropriate thickness of material so as to provide suitable flexibility to one or more of the various spring fingers 412. So formed, the spring fingers may deflect in response to a displacement force, such as when engaging a corresponding portion of a chassis cage slot, for example. As the fingers tend to be biased to their non-displaced positions (shown in FIG. 6), this configuration enables the flexible spring fingers to serve as dampers for damping encountered shock and vibration of the carrier. Additionally, slots 432 formed between adjacent ones of the spring fingers may be appropriately sized and shaped for inhibiting propagation of electromagnetic energy beyond the material of the spring fingers. The flexible configuration of the spring fingers also accommodates variable pitch arrangements of multiple carriers.

The structure and accompanying functionality of bezel 408 and cam handle 410 will now be described in greater detail. As shown in FIG. 7, bezel 408 defines an interior cavity 440 that is adapted to receive a thumb latch 442. Pivot bosses 444 also are provided that are adapted to be received within corresponding pivot holes 446 of cam handle 410. Pivot bosses 444 preferably are provided on sidewalls 445 of the bezel, with the pivot holes 446 preferably being formed through sidewalls 447 of the cam handle. So received, engagement of the bosses 444 within the holes 446 permits pivoting of cam handle 410 about the bosses 444 between an open or unlatched position and a closed or latched position.

Each of bezel sidewalls 445 preferably incorporates a recessed portion 449 that is adapted to facilitate seating of the cam handle sidewalls 447 when the cam handle is in the latched position. In the embodiment depicted in FIG. 7, the surface defining each bezel sidewall recessed portion 449 extends to form a contoured profile of the bezel that provides appropriate clearance between the bezel and portions of the cam handle during pivoting of the cam handle.

Bezel 408 also preferably includes a recessed portion 450 that is adapted to provide clearance between the distal end 451 of the cam handle and the face 452 of the bezel. This recessed portion enables a finger of a user to be inserted between the distal end of the cam handle and the bezel so as to facilitate grasping and pivoting of the cam handle.

In order to facilitate mounting of the carrier module 400 into a corresponding chassis slot, for example, cam handle 410 incorporates one or more cam latches 460. In a preferred embodiment, dual cam latches 460 are provided, with each of the latches extending generally upwardly from a sidewall 447 of the cam handle. Cam latches 460 facilitate mounting of the carrier module 400 by engaging a corresponding latching surface. Preferably, spacing of the cam latches from each other is sufficient to enable nesting of the cam latches around the rails of an adjacently disposed carrier. Thus, line-to-line stacking of carriers may be accommodated.

Various opening also are provided within and through the carrier to promote cooling of the storage device mounted thereto. For instance, cam handle 410 includes one or more louvers 502 that, in addition to the thumb opening 470 and finger opening 472, are adapted to permit air to flow through the handle. Once passing through the handle, air may flow through cavity 440 of the bezel, and then through the various apertures 422 of the EMI shield 406. After passing through the EMI shield, air may reach the storage device 413 by passing through one or more frame openings 504. Airflow toward and away from the storage device also is provided by apertures 506 formed through the PCA cover 404. Various materials for promoting cooling of heat producing components and/or protecting a user from such components also may be utilized.

As is evident form the previous discussion, numerous advantages may be achieved by extensive utilization of ESD dissipative material in a module, for example. Additionally, in those embodiments formed partially of metal, potentially beneficial thermal properties may be exhibited.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. By way of example, embodiments of the present invention include system enclosures incorporating first contact points formed, at least partially, of dissipative material. In these embodiments, some of the corresponding modules may be formed entirely of metal. All such modifications and variations are intended to be included herein within the scope of this disclosure and the present invention and protected by the following claims.

What is claimed is:

1. An enhanced electrostatic discharge protection system comprising:

a module configured to be received by an enclosure, said module including an electronic component configured to electrically communicate with at least a portion of the enclosure when said module is received by the enclosure, said module having a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is controllably discharged;

wherein the exterior of the module is entirely formed of said dissipative material.

2. An enhanced electrostatic discharge protection system comprising:

a module configured to be received by an enclosure, said module including an electronic component configured to electrically communicate with at least a portion of the enclosure when said module is received by the enclosure, said module having a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is controllably discharged;

wherein only said first contact portion of said exterior of said module is formed of said dissipative material.

3. An enhanced electrostatic discharge protection system comprising:

a module configured to be received by an enclosure, said module including an electronic component configured to electrically communicate with at least a portion of the enclosure when said module is received by the enclosure, said module having a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is controllably discharged;

wherein said dissipative material is a conductive plastic.

4. The system of claim 2, further comprising:

an enclosure configured to receive said module, said enclosure having a module-receiving slot formed therein such that said module is mountable within said module-receiving slot.

5. An enhanced electrostatic discharge protection system comprising:

a module configured to be received by an enclosure, said module including an electronic component configured to electrically communicate with at least a portion of the enclosure when said module is received by the enclosure, said module having a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is controllably discharged;

wherein said module is configured as a controller module, said controller module having a platform and a guide foot, said guide foot being mounted to said platform forming said first contact portion of said module, said guide foot being configured to engage a surface of an enclosure such that engagement of said guide foot with the surface promotes alignment of said module relative to the enclosure as said module is received within the enclosure.

6. An enhanced electrostatic discharge protection system comprising:

a module configured to be received by an enclosure, said module including an electronic component configured to electrically communicate with at least a portion of the enclosure when said module is received by the enclosure, said module having a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is controllably discharged;

wherein said module is configured as a storage medium carrier module, said storage medium carrier module having a frame and a cover, said frame and said cover engaging each other to form at least a portion of a storage medium enclosure, said storage medium enclosure being sized and shaped to receive therein at least a portion of a storage medium device, said frame being formed, at least partially, of said dissipative material.

7. An enhanced electrostatic discharge protection system comprising:

a module configured to be received by an enclosure, said module including an electronic component configured to electrically communicate with at least a portion of the enclosure when said module is received by the enclosure, said module having a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is controllably discharged;

wherein said module is configured as a controller module, said controller module comprising:

a platform;

a memory device mounted to said platform; and means for aligning said module relative to the enclosure as said module is received within the enclosure.

8. An enhanced electrostatic discharge protection system comprising:

a module configured to be received by an enclosure, said module including an electronic component configured to electrically communicate with at least a portion of the enclosure when said module is received by the enclosure, said module having a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is controllably discharged;

wherein said dissipative material has a substantially uniform volume resistivity.

9. The system of claim 3, wherein said conductive plastic comprises graphite filler.

10. The system of claim 6, wherein said frame has a face plate and first and second rails extending outwardly therefrom, said first rail forming said first contact portion of said module, said first rail being longer than said second rail and being configured to reduce a potential for electrical arcing between said module and the enclosure.

11. The system of claim 7, wherein said means for aligning said module relative to the enclosure includes means for engaging a surface of the enclosure.

12. The system of claim 11, further comprising:

an enclosure configured to receive said module, said enclosure having a module-receiving slot formed therein such that said module is mountable within said module-receiving slot.

13. An enhanced electrostatic discharge protection system comprising:

a module configured to be received by an enclosure, means for electrically communicating with at least a portion of the enclosure when said module is received by the enclosure, and means for dissipating an electrostatic charge of said module such that a potential for electrical arcing between said module and the enclosure is reduced;

wherein said module has a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is, discharged in a controlled manner, and at least partially, dissipated as heat;

wherein said dissipative material is a conductive plastic.

14. An enhanced electrostatic discharge protection system comprising:

a module configured to be received by an enclosure, means for electrically communicating with at least a portion of the enclosure when said module is received by the enclosure, and means for dissipating an electrostatic charge of said module such that a potential for electrical arcing between said module and the enclosure is reduced;

wherein said module has a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is, discharged in a controlled manner, and at least partially, dissipated as heat;

wherein said dissipative material has a substantially uniform volume resistivity.

15. An enhanced electrostatic discharge protection system comprising:

a module configured to be received by an enclosure, means for electrically communicating with at least a portion of the enclosure when said module is received by the enclosure, means for dissipating an electrostatic charge of said module such that a potential for electrical arcing between said module and the enclosure is reduced;

wherein said module has a first contact portion formed on an exterior thereof, said first contact portion being arranged to contact the enclosure as said module is received by the enclosure, said first contact portion being formed, at least partially, of a dissipative material, such that, when said first contact portion engages the enclosure, an electrostatic charge of said module is, discharged in a controlled manner, and at least partially, dissipated as heat;

wherein said means for dissipating an electrostatic charge includes a layer of dissipative material.

16. The system of claim 2, further comprising:

an enclosure configured to receive said module, said enclosure having a module-receiving slot formed therein such that said module is mountable within said module-receiving slot.

17. The system of claim 3, further comprising:

an enclosure configured to receive said module, said enclosure having a module-receiving slot formed therein such that said module is mountable within said module-receiving slot.

18. The system of claim 5, further comprising:

an enclosure configured to receive said module, said enclosure having a module-receiving slot formed therein such that said module is mountable within said module-receiving slot.

19. The system of claim 6, further comprising:

an enclosure configured to receive said module, said enclosure having a module-receiving slot formed therein such that said module is mountable within said module-receiving slot.

20. The system of claim 7, further comprising:

an enclosure configured to receive said module, said enclosure having a module-receiving slot formed therein such that said module is mountable within said module-receiving slot.

21. The system of claim 8, further comprising:

an enclosure configured to receive said module, said enclosure having a module-receiving slot formed therein such that said module is mountable within said module-receiving slot.

22. The system of claim 14, further comprising:

an enclosure configured to receive said module, said enclosure having a module-receiving slot formed therein such that said module is mountable within said module-receiving slot.

23. The system of claim 15, further comprising:

an enclosure configured to receive said module, said enclosure having a module-receiving slot formed therein such that said module is mountable within said module-receiving slot.

24. The system of claim 13, wherein said conductive plastic comprises graphite filler.

* * * * *